United States Patent
Offermans et al.

(10) Patent No.: US 8,044,421 B2
(45) Date of Patent: Oct. 25, 2011

(54) LIGHT EMITTING DEVICE WITH TENSION RELAXATION

(75) Inventors: Paulus H. G. Offermans, Eindhoven (NL); Lucas J. A. M. Beckers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 213 days.

(21) Appl. No.: 12/439,295

(22) PCT Filed: Sep. 18, 2007

(86) PCT No.: PCT/IB2007/053765
§ 371 (c)(1), (2), (4) Date: Feb. 27, 2009

(87) PCT Pub. No.: WO2008/035283
PCT Pub. Date: Mar. 27, 2008

(65) Prior Publication Data
US 2010/0012958 A1 Jan. 21, 2010

(30) Foreign Application Priority Data
Sep. 22, 2006 (EP) .................................... 06121092

(51) Int. Cl.
*H01L 33/00* (2010.01)
*H01L 21/00* (2010.01)
*C03B 11/08* (2006.01)
*C03B 23/22* (2006.01)
*C03C 27/00* (2006.01)
*C03C 29/00* (2006.01)

(52) U.S. Cl. ........... 257/98; 257/E33.061; 257/E33.068; 438/29; 65/38; 65/43

(58) Field of Classification Search .................. None
See application file for complete search history.

(56) References Cited

U.S. PATENT DOCUMENTS

| | | | |
|---|---|---|---|
| 4,743,302 A | 5/1988 | Dumesnil et al. | |
| 5,958,100 A | 9/1999 | Farnworth et al. | |
| 5,965,469 A | 10/1999 | Kilgo et al. | |
| 2002/0179919 A1 | 12/2002 | Deisenhofer et al. | |
| 2003/0107046 A1 | 6/2003 | Waitl et al. | |
| 2004/0212060 A1 | 10/2004 | Hachitani | |
| 2006/0049421 A1* | 3/2006 | Suehiro et al. | 257/99 |
| 2006/0174652 A1* | 8/2006 | Khanarian et al. | 65/38 |

FOREIGN PATENT DOCUMENTS

| | | |
|---|---|---|
| EP | 1267420 A2 | 12/2002 |
| EP | 1603170 A1 | 12/2005 |
| JP | 09148326 A | 6/1997 |
| JP | 2005011933 | 1/2005 |
| JP | 2005072129 | 3/2005 |
| WO | 2005109529 A1 | 11/2005 |

OTHER PUBLICATIONS

T. Banu et al; "Preparation, Characterisation, Optical, Thermal and Conductivity Studies of Lead Oxyfluoride Glasses", Phys. Chem. Glasses, Sheffield, GB, Dec. 2005, vol. 46, No. 6, pp. 564-569, XP001500789.

* cited by examiner

Primary Examiner — Hoang-Quan Ho

(57) ABSTRACT

A light emitting device is provided, comprising a light emitting diode 10, where the light emitting surface 11 thereof is bound to an optical element 13 by means of a bonding material 12 comprising a phosphate glass or an oxide glass having Tg<250° C. In operation of the device, when the temperature approaches or exceeds Tg of the bonding material, the bonding material gets fluidic and can thus relax any thermally induced stresses between the light emitting diode and the optical element.

8 Claims, 1 Drawing Sheet

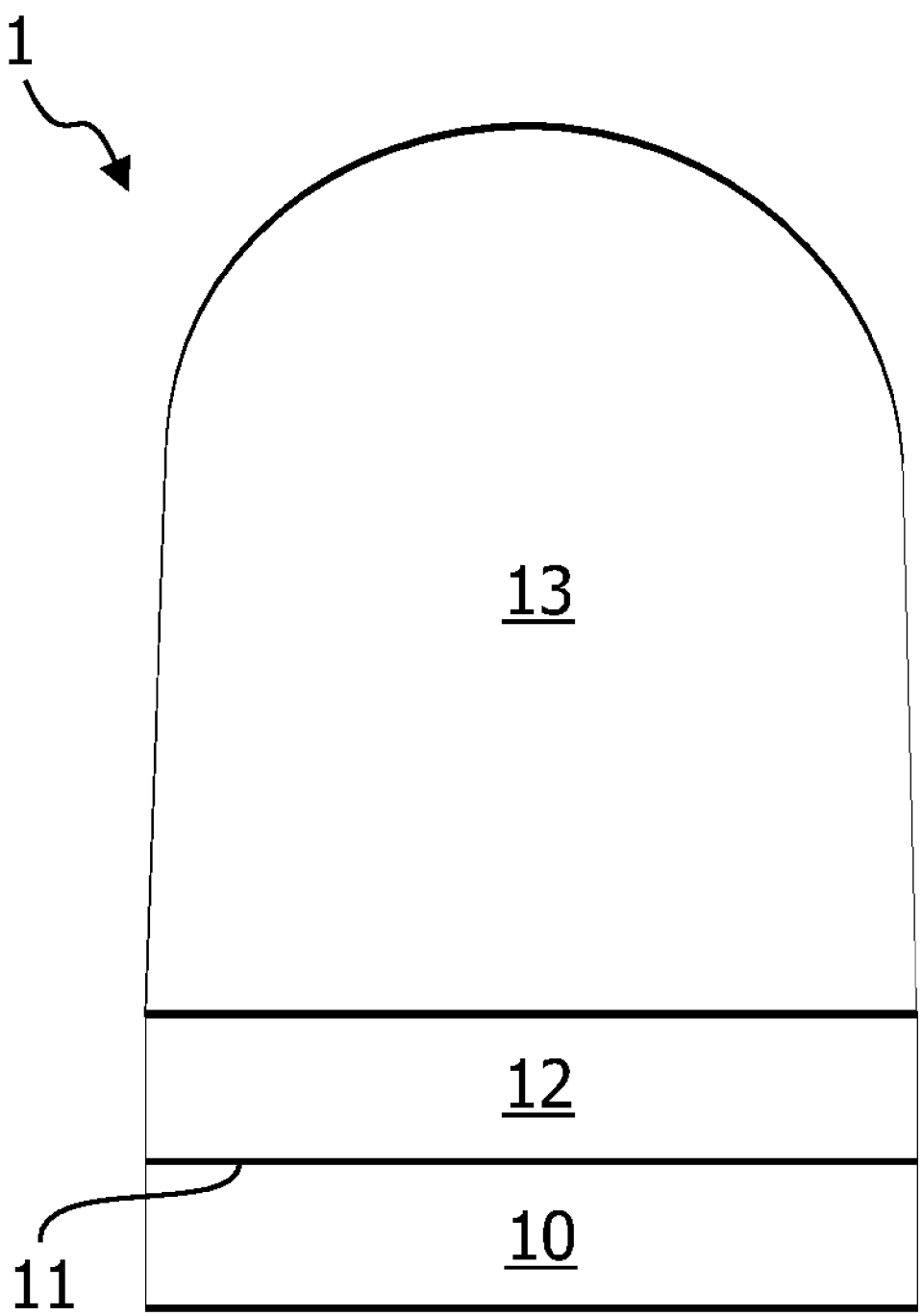

LIGHT EMITTING DEVICE WITH TENSION RELAXATION

This application is a national stage application under 35 U.S.C. §371 of International Application No. PCT/IB2007/053765 filed on Sep. 18, 2007, and published in the English language on Mar. 27, 2008 as International Publication No. WO/2008/035283, which claims priority to European Application No. 06121092.8, filed on Sep. 22, 2006, incorporated herein by reference.

FIELD OF THE INVENTION

A light-emitting device comprising at least one light emitting diode and at least one optical element bonded to a light-emitting surface of said at least one light emitting diode by means of a bonding material.

BACKGROUND OF THE INVENTION

Light emitting diodes (LEDs) are currently contemplated as light sources for several different lighting applications, and the use of light emitting diodes is expected to grow in the coming years.

A light emitting diode is typically comprised in a package containing the actual LED-chip comprising the active, light producing, layers, and light extraction optics arranged on the LED-chip. The light extraction efficiency between the chips ant the optics of the package is a major issue with which LEDs are confronted.

A classical approach in this context involves the use of primary extraction optics, e.g. optical domes provided on the LED-chips, which optical domes extract the light based on their refractive properties. The materials of these optical domes are often based on silicones and polymers (such as PMMA). However, these optical domes have limited photo-thermal stability, which limits the power of the used LED-chips, which in turn limits the lumen power of the light-emitting device.

An approach to solve this is to use inorganic optical elements for the extraction of light from LED chips. The material of such optical elements can for example be polycrystalline ceramic materials or glass. Such inorganic optical elements have much higher photo-thermal stability, which allows light emitting devices with high lumen power and output.

However, high power LEDs may dissipate significant amounts of heat, and the radiation may be intense. In this context, the bond between the LED chip and the extraction optics, which forms a junction that couples light from the LED chip to the extraction optics and that physically binds the extraction optics to the LED chip, should itself exhibit high photo-thermal stability, so that it is not the limiting factor in the light-emitting device, and so that it is able to benefit from the high photo-thermal stability of the inorganic extraction optics.

However, as high power LEDs may dissipate a lot of heat in operation, slight differences between the coefficients of thermal expansion for the LED-chip, the bonding material and extraction optics results in build-up of heat induced tensions in the package, eventually leading to breakage of the package. Thus, there is a need for a light-emitting device where the bond between the LED-chip and the extraction optics can withstand the load and stress it is exposed to.

SUMMARY OF THE INVENTION

It is an object of the present invention to overcome this problem, and to provide a light-emitting device according to the appended claims that exhibits a relaxation of the above-mentioned heat induced tensions.

The present inventors have found that the glass material having a glass transition temperature ($T_g$) lower or approximately the same as the temperature reached in the LED-package during operation advantageously may be used as a bonding material to bond optical elements to light emitting diodes in a LED-package. During operation of the LED, the temperature of the LED-package will gradually increase from ambient to a working temperature, at which the differences in coefficient of thermal expansion between the LED chip and the optical element could lead to break-down of the package. However, as the working temperature is approached, also the $T_g$ of the bonding material is approached, and eventually the bonding material comes fluidic, and any heat-induced tension is relaxed by means of this fluidic layer, acting as a tension buffer.

Thus, in a first aspect, the present invention relates to a light emitting device comprising at least one light emitting diode and at least one optical element bonded to a light emitting surface of said at least one light emitting diode by means of a bonding material, wherein said bonding material comprises a glass material, selected from the group consisting of phosphate glass and oxide glass, and having a $T_g$ of up to 250° C.

It should be noted that phosphate glasses are known as such and have previously been used in connection with light-emitting diodes. For example, US patent application no 2002/0179919 A1 describes the use of phosphate glasses to bond a ring-shaped top to the lead frames of an LED and to a base body.

When applied as a bonding material between LED-chips and optical elements, there is the additional effect that the material exhibits good properties as a bonding material for obtaining a physical and an optical bond between the LED-chip and the optical element, and is capable of relaxing thermally induced tension, therefore making it very suitable as a bonding material between LED chips and optical elements arranged directly on the LED chips.

Examples of suitable phosphate glasses include, but are not limited to tin phosphate glass, lithium phosphate glass, sodium phosphate glass, potassium phosphate glass, cesium phosphate glass, tellurium phosphate glass and mixtures thereof.

Examples of suitable oxide glasses include, but are not limited to tungsten/tellurium oxide glass, sodium/zinc/tellurium oxide glass, barium zinc/tellurium oxide glass and mixtures thereof.

In embodiments of the present invention, the LED is of flip-chip type, where the anode and the cathode are arranged on the same side of the light-emitting surface. This type of LED provides a light-emitting surface on which it is suitable to directly bond an optical element.

In preferred embodiments, the optical element is of an inorganic material. To fully take advantage of the proposed bonding material, it is advantageous that the optical element is photo- and thermally stable, so that the light emitted by and the heat dissipated from the light emitting diode does not act deteriorating on the optical element, thereby compromising the function of the device. Inorganic materials, such as polycrystalline ceramic materials and certain glass materials, are among the materials having the desired properties.

In embodiments of the present invention, the optical element and or the bonding material, arranged between the light emitting diode and the optical element, may comprise a luminescent compound. In certain applications, an at least partial color-conversion of the light emitted from the light emitting diode is desired. For instance, white light may be produced from a blue light emitting diode by using a yellow emitting fluorescent compound to convert part of the blue light into yellow.

In a second aspect, the present invention relates to a method for the manufacture of a light emitting device, comprising providing at least one light emitting diode and at least one optical element; arranging a bonding material comprising a phosphate glass or an oxide glass having a $T_g$ of up to 250° C. on a light emitting surface of said at least one light emitting diode and/or on a surface of said at least one optical element; placing said at least one optical element on said light emitting surface of said at least one light emitting diode with said bonding material there between to form an assembly; and heating said bonding material at a temperature at or above the $T_g$ thereof to bond said at least one optical element to said at least one light emitting diode.

In embodiments of the present invention, the heating for bonding may be performed while compressing said assembly.

BRIEF DESCRIPTION OF THE DRAWINGS

These and other aspects of the present invention will now be described in more detail, with reference to the appended drawings showing a currently preferred embodiment of the invention.

FIG. 1 is a cross sectional view of a light emitting device according to one embodiment of the present invention.

DETAILED DESCRIPTION

The present invention relates, in one aspect, to a light emitting device comprising a LED-chip and an optical element bound to a light emitting surface of said LED chip by means of a bonding material based on the use of glass materials having a glass transition temperature below the operating temperature of the LED-package.

One embodiment of such a light-emitting device 1, as illustrated in FIG. 1, comprises a light emitting diode (LED) 10 having a light-emitting surface 11, i.e. a surface through which light produced exits the LED.

An optical element 13 is arranged on the light-emitting surface 11 of the LED 10, and is bound thereto by means of a bond 12 comprising a bonding material.

The bonding material is mainly constituted by a glass material having a glass transition temperature ($T_g$) of up to 250° C.

The location of the bonding material is not limited to only be arranged on the light emitting surface of the LED, but may also be located on other interfaces between the light emitting diode and the optical element.

Preferably, the bonding material is selected such that the glass transition temperature is at or below the temperatures reached in the device when operating.

As used herein, the term "light emitting diode (abbreviated LED)" refers to all types of light emitting diodes known to those skilled in the art, and includes, but is not limited to inorganic based light emitting diodes, organic based light emitting diodes, such as polyLEDs and OLEDs, and also refers to laser diodes. In the context of the present invention, "light" is taken to encompass the wavelength range of from ultra-violet radiation to infrared radiation, especially the visible and near visible range therein.

The device of the present application is especially suited for, but not limited to, use with high power LEDs, for example such LEDs that might reach temperatures of 250° C. and above during operation. Further, so-called flip-chip LEDs, having both the cathode and the anode on the same side of the light-emitting surface, are especially contemplated for use in the present invention.

Further, LEDs having an inorganic light-emitting surface, such as a mono-crystalline surface, for example of sapphire, are especially contemplated for use in the present invention.

The optical element 13 arranged on the LED 10 may be of an organic material, such as PMMA, or may be of an inorganic material, such as polycrystalline ceramic materials or glass materials.

The optical element 13 is typically translucent or transmissive for the light emitted by the underlying LED.

As inorganic materials, such as polycrystalline ceramics and glass, often are more photo- and thermally stable, the optical element 13 is preferably of an inorganic material.

The optical element is typically in the form of a dome or a plate, and is designed to receive and transmit light emitted by the light emitting diode.

In certain embodiments, the optical element may comprise a luminescent (i.e. fluorescent and/or phosphorescent) material that may convert the color of the light emitted by the LED.

The optical element may, depending on its shape and/or constitution, for example act as a refractive element, such as a lens or a dome for out-coupling of the light, as a collimator and/or as a color-converting element.

In certain embodiments, the bonding material may comprise a luminescent (i.e. fluorescent and/or phosphorescent) material that may convert the color of the light emitted by the LED.

Glass materials suitable for use in the present invention include glasses that have a glass transition temperature $T_g$ at or lower than 250° C. Examples of such glass materials include phosphate glasses, such as tin phosphate glass, lithium phosphate glass, sodium phosphate glass, potassium phosphate glass, cesium phosphate glass and tellurium phosphate glass, and oxide glass, such as tungsten/tellurium oxide glass, sodium/zinc/tellurium oxide glass and barium/zinc/tellurium oxide glass.

When in operation of the device 1, the LED 10 emits light under production of heat. The higher lumen power of the LED, the more heat is dissipated from the LED. The heat dissipation leads to an increased temperature of the LED 10, the bond 12 and the optical element 13. In turn, this leads to changes in the dimensions of the LED, the bond and the optical element. The extent of these changes depends on the coefficient of thermal expansion ($L/L_0(° C.^{-1})$).

High temperature increments leads to high dimension changes, and if there is even the slightest mismatch between the thermal expansion coefficients, tensions will build up in the device.

However, as the temperature of the device approaches $T_g$ of the glassy bonding material, the bonding material turns in to a fluidic state. The bonding material in fluidic state may then relax the built-up tensions between the optical element and the light-emitting diode.

Hence, there will be a drastic reduction in terms of thermally induced breakdowns when bonding materials of the present invention are used to bind the LED to the optical element.

A light-emitting device of the present invention may be produced by the following method.

In a first step, a light emitting diode and an optical element, both as described above, are provided. A bonding material, here comprising a glass material as defined above, having a $T_g$ of at or below 250° C., is arranged on the light-emitting surface of the light emitting diode and/or on a surface of the optical element adapted to face the light emitting diode. The bonding material may be arranged on the whole or part of the surfaces.

For example, the bonding material may be arranged on the surface(s) by melting a piece of the bonding material on the surface, by glass foil transfer or high temperature jetting of the glass.

The optical element is arranged on the LED with the bonding material there between, to form an assembly. Thereafter, at least the bonding material, but typically the whole assembly, is heated to a temperature above $T_g$ of the bonding material, to optically bind the optical element to the LED.

The person skilled in the art realizes that the present invention by no means is limited to the preferred embodiments described above. On the contrary, many modifications and variations are possible within the scope of the appended claims. For example, even though one LED chip is shown in FIG. 1, a plurality of LED chips may be bonded to one optical element to form a multi LED assembly.

The invention claimed is:

1. A light emitting device comprising at least one light emitting diode and at least one optical element bonded to a light emitting surface of said at least one light emitting diode by means of a bonding material comprising a first luminescent compound and a glass material comprising a tin phosphate glass and an oxide glass and having a $T_g$ of up to 250° C., said oxide glass being selected from the group consisting of tungsten/tellurium oxide glass, sodium/zinc/tellurium oxide glass, barium/zinc/tellurium oxide glass and mixtures thereof.

2. A light emitting device according to claim 1, wherein said at least one light emitting diode is a flip-chip type light emitting diode.

3. A light emitting device according to claim 1, wherein said optical element comprises an inorganic material.

4. A light emitting device according to claim 1, wherein said optical element comprises a second luminescent compound.

5. A method for the manufacture of a light emitting device, comprising
  providing at least one light emitting diode and at least one optical element;
  arranging a bonding material comprising a first luminescent compound and a glass material, comprising a tin phosphate glass and an oxide glass, and having a $T_g$ of up to 250° C., said oxide glass being selected from the group consisting of tungsten/tellurium oxide glass, sodium/zinc/tellurium oxide glass, barium/zinc/tellurium oxide glass and mixtures thereof, on a light emitting surface of said at least one light emitting diode and/or on a surface of said at least one optical element;
  placing said at least one optical element on said light emitting surface of said at least one light emitting diode with said bonding material there between to form an assembly; and
  heating said bonding material at a temperature above the $T_g$ thereof to bond said at least one optical element to said at least one light emitting diode.

6. A method according to claim 5, wherein said heating is performed while compressing said assembly.

7. A method according to claim 5, wherein said optical element comprises an inorganic material.

8. A method according to claim 5, wherein said optical element comprises a second luminescent compound.

* * * * *